US012701811B2

(12) United States Patent
Shinohara

(10) Patent No.: US 12,701,811 B2
(45) Date of Patent: Aug. 4, 2026

(54) PHOTOELECTRIC CONVERSION DEVICE

(71) Applicant: CANON KABUSHIKI KAISHA, Tokyo (JP)

(72) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 331 days.

(21) Appl. No.: 18/338,478

(22) Filed: Jun. 21, 2023

(65) Prior Publication Data

US 2023/0420475 A1 Dec. 28, 2023

(30) Foreign Application Priority Data

Jun. 22, 2022 (JP) ................................. 2022-100419

(51) Int. Cl.
H10F 39/00 (2025.01)
H10F 39/18 (2025.01)

(52) U.S. Cl.
CPC ........... H10F 39/811 (2025.01); H10F 39/18 (2025.01)

(58) Field of Classification Search
CPC ...... H10F 39/811; H10F 39/813; H10F 39/18; H10F 39/199; H10F 39/802; H10F 39/8033; H10F 39/807
See application file for complete search history.

(56) References Cited

U.S. PATENT DOCUMENTS

| | | | |
|---|---|---|---|
| 7,394,492 B2 | 7/2008 | Shinohara | |
| 7,741,593 B2 | 6/2010 | Iwata | |
| 7,821,551 B2 | 10/2010 | Shinohara | |
| 7,884,870 B2 | 2/2011 | Shinohara | |
| 8,139,133 B2 | 3/2012 | Iwane | |
| 8,164,668 B2 | 4/2012 | Iida | |

(Continued)

FOREIGN PATENT DOCUMENTS

| | | |
|---|---|---|
| JP | 2011-029337 A | 2/2011 |
| JP | 2014-199898 A | 10/2014 |

(Continued)

OTHER PUBLICATIONS

Kang et al., Pixel Design and Photodiode Process Technology for Image Sensor Applications, 2012 International SoC Design Conference, IEEE, 2012, pp. 320-323, DOI:10.1109/ISOCC.2012. 6407105.

(Continued)

*Primary Examiner* — Tucker J Wright
(74) *Attorney, Agent, or Firm* — Venable LLP

(57) ABSTRACT

A photoelectric conversion device including pixels arranged in a semiconductor layer including first and second main surfaces is provided. Each of the pixels includes a first photodiode including a first region of a first conductivity type where signal charges are accumulated, a second photodiode arranged between the first region and the second main surface so as to at least partially overlap the first region, and including a second region of the first conductivity type where signal charges are accumulated, a third region of a second conductivity type arranged between the first and second region, and a first electrode arranged on the first main surface so as to cover the first region. Signal charges accumulated in the second region are transferred to the first region via a transfer portion formed in the third region by controlling a potential of the first electrode.

18 Claims, 11 Drawing Sheets

(56)            References Cited

U.S. PATENT DOCUMENTS

| | | |
|---|---|---|
| 8,274,587 B2 | 9/2012 | Hynecek |
| 8,345,137 B2 | 1/2013 | Shinohara |
| 8,350,942 B2 | 1/2013 | Shinohara |
| 8,368,784 B2 | 2/2013 | Yamaguchi |
| 8,471,942 B2 | 6/2013 | Shinohara |
| 8,896,734 B2 | 11/2014 | Shinohara |
| 8,970,769 B2 | 3/2015 | Shinohara |
| 9,437,647 B2 | 9/2016 | Shinohara |
| 10,008,521 B2 | 6/2018 | Sekine |
| 10,535,688 B2 | 1/2020 | Onuki |
| 10,714,515 B2 | 7/2020 | Shinohara |
| 10,771,720 B2 | 9/2020 | Shinohara |
| 10,818,724 B2 | 10/2020 | Shinohara |
| 10,903,260 B2 | 1/2021 | Chen et al. |
| 10,944,931 B2 | 3/2021 | Shinohara |
| 11,056,520 B2 | 7/2021 | Onuki |
| 11,094,725 B2 | 8/2021 | Tanaka et al. |
| 11,503,234 B2 | 11/2022 | Shinohara |
| 11,553,149 B2 | 1/2023 | Shinohara |
| 11,626,431 B2 | 4/2023 | Shinohara |
| 11,728,358 B2 | 8/2023 | Shinohara |
| 2006/0128126 A1* | 6/2006 | Adkisson .............. H10F 39/807 |
| | | 438/525 |
| 2011/0249158 A1 | 10/2011 | Hynecek |
| 2013/0015513 A1* | 1/2013 | Kido ..................... H10F 39/807 |
| | | 257/292 |
| 2013/0193496 A1 | 8/2013 | Hisanori |
| 2016/0020236 A1* | 1/2016 | Tanaka ................ H10F 39/8033 |
| | | 257/233 |
| 2016/0337605 A1 | 11/2016 | Ito |
| 2023/0038959 A1 | 2/2023 | Sekine |

FOREIGN PATENT DOCUMENTS

| | | |
|---|---|---|
| JP | 2015-056408 A | 3/2015 |
| JP | 2021-528838 A | 10/2021 |

OTHER PUBLICATIONS

Office Action dated Jun. 12, 2026, in Japanese Patent Application No. 2022-100419.

\* cited by examiner

F I G. 3
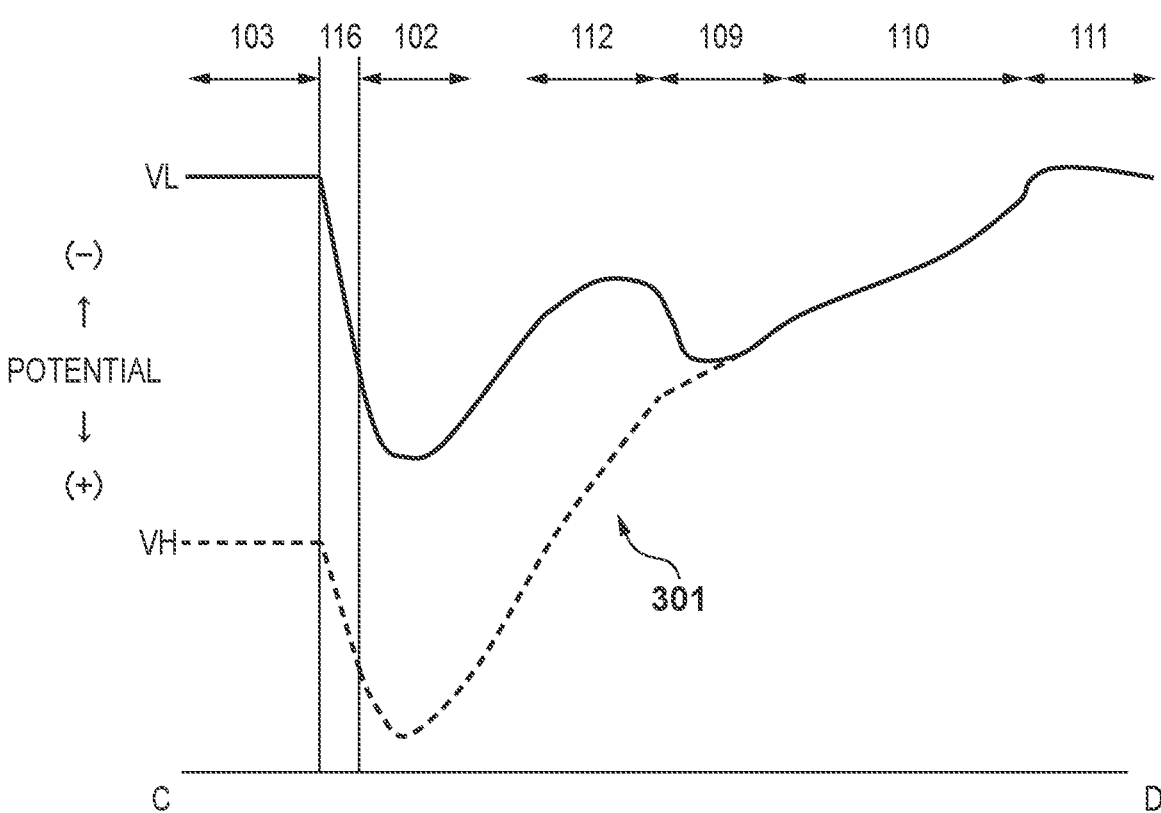
F I G. 4
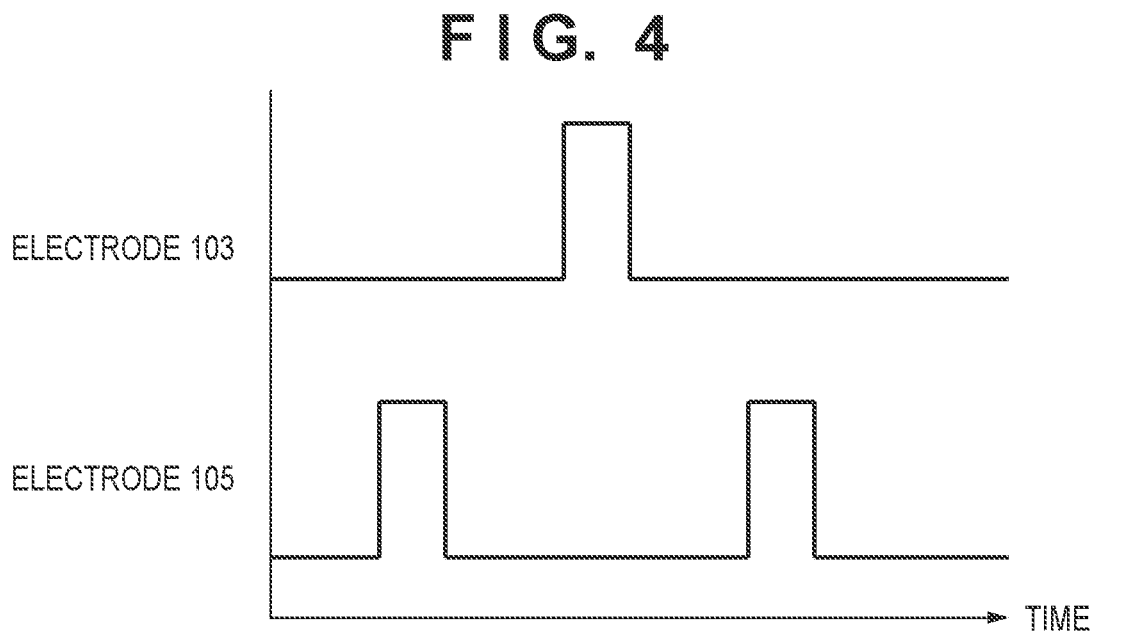

FIG. 5

F I G. 7
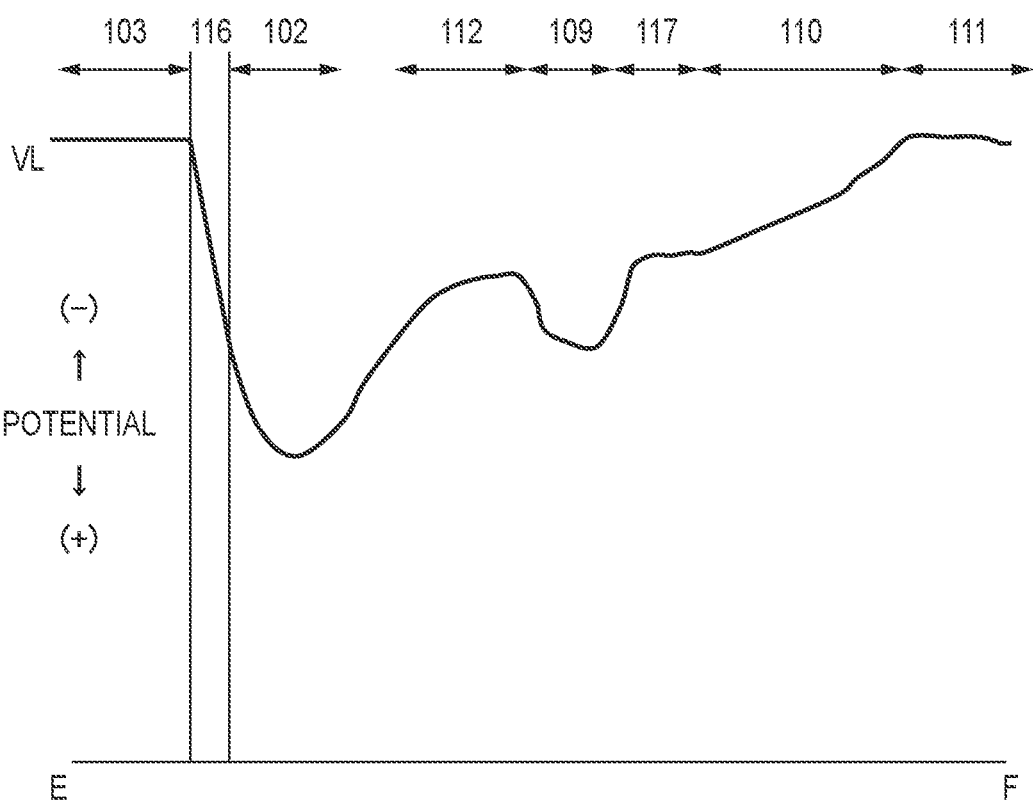

F I G. 10
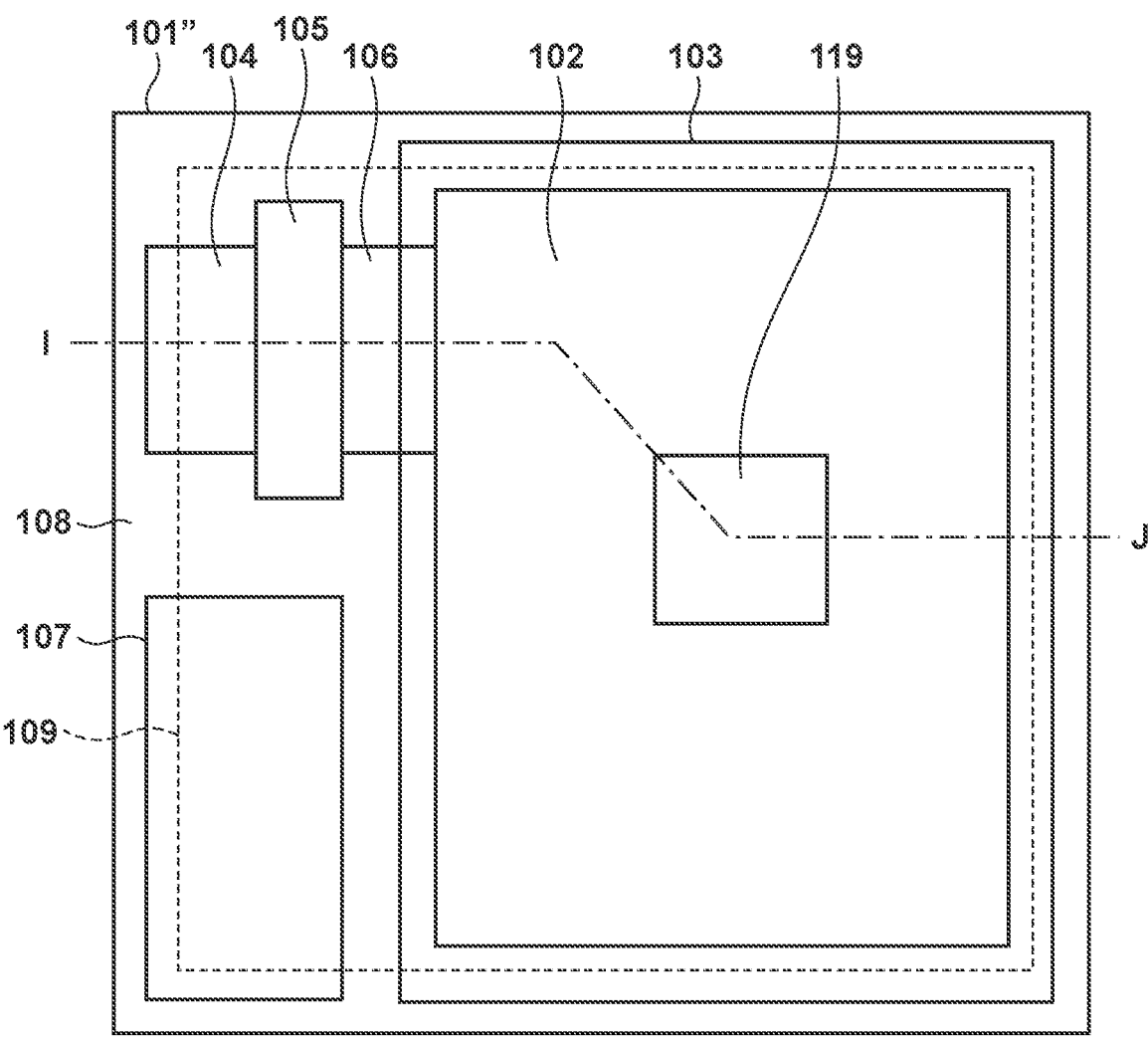

F I G. 11
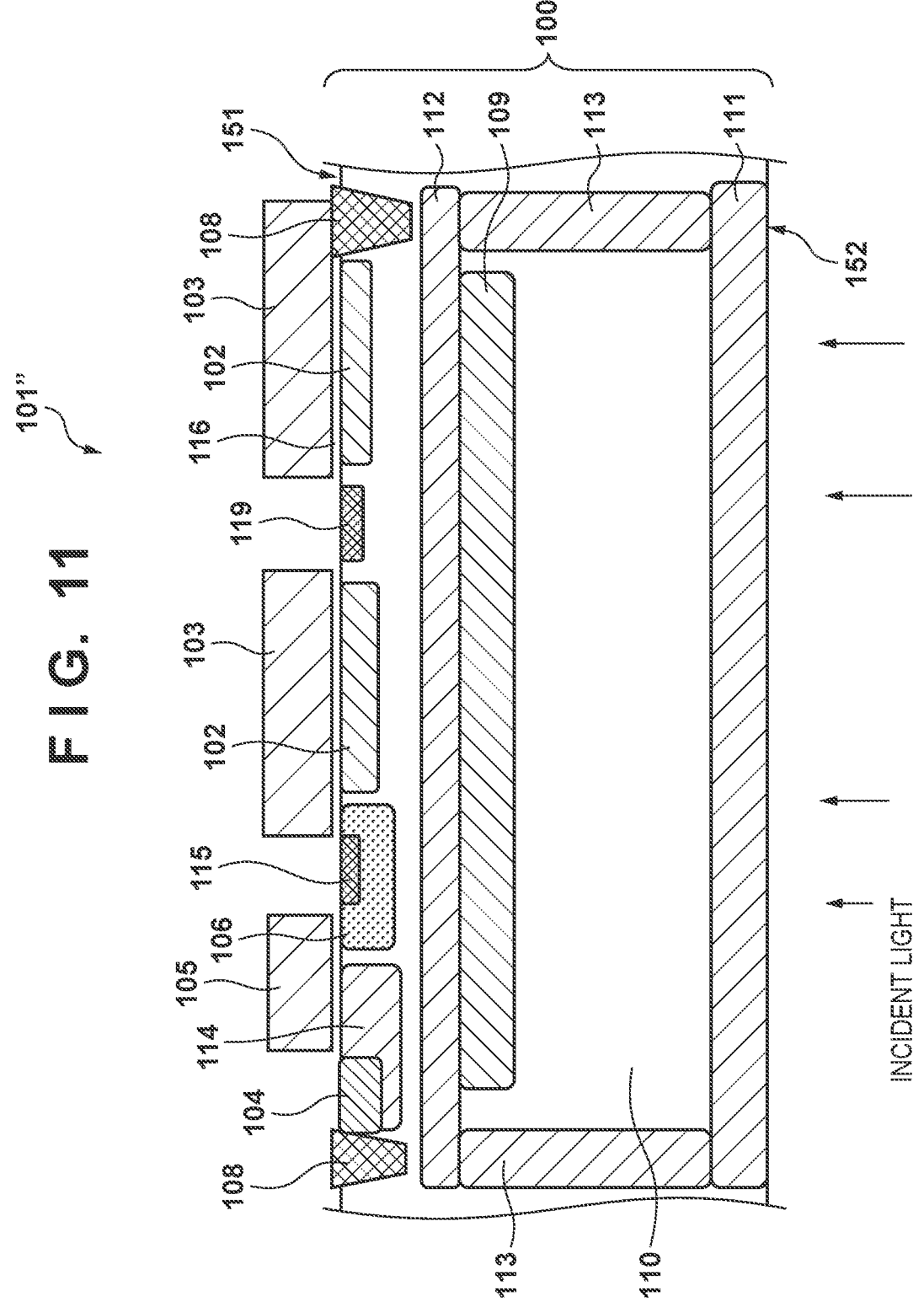
INCIDENT LIGHT

F I G. 12
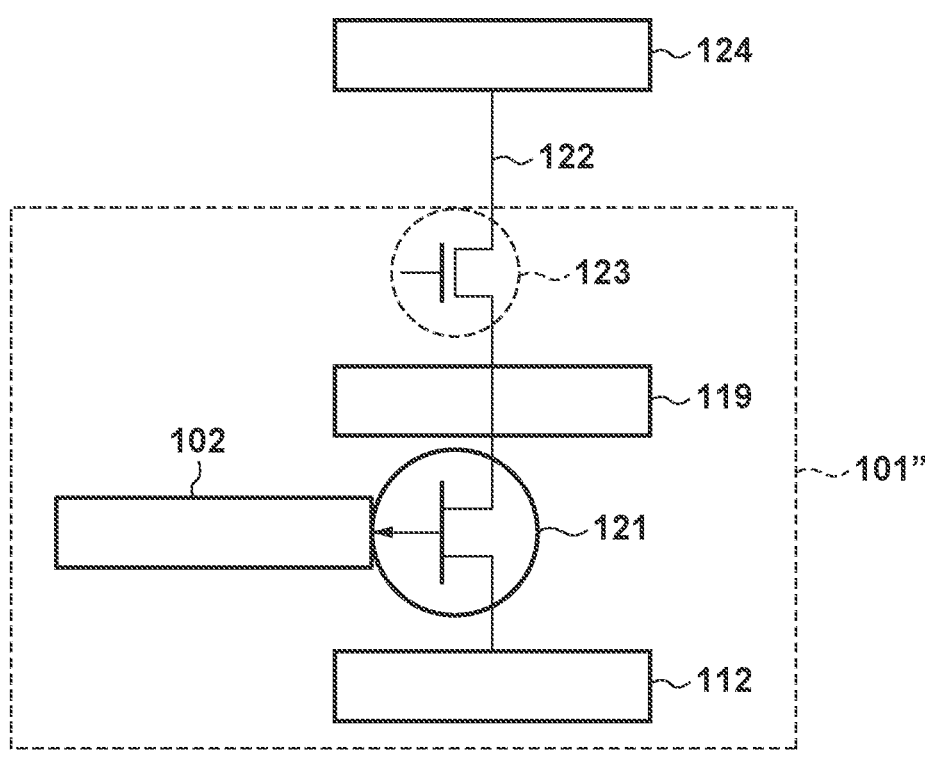

1

PHOTOELECTRIC CONVERSION DEVICE

BACKGROUND OF THE INVENTION

Field of the Invention

The present invention relates to a photoelectric conversion device.

Description of the Related Art

Improvement of the image quality of a photoelectric conversion device has been achieved by decreasing the pixel size and increasing the number of pixels, thereby improving the resolution. However, decrease in pixel size is accompanied with reduction in saturation signal amount, which can reduce the dynamic range. In addition, a dielectric or the like for electrically separating a photodiode (to be sometimes referred to as a PD hereinafter) from transistors is arranged in the pixel. When the pixel size is decreased, the distance between the PD and the dielectric decreases, and the SN ratio can decrease due to the influence of dark current which occurs at the interface between the dielectric and the PD. U.S. Pat. No. 8,274,587 describes that, in addition to a buried PD arranged on the side of one main surface of a semiconductor layer, another PD isolated by a diffusion layer is arranged in the bulk between the buried PD and the other main surface of the semiconductor layer.

SUMMARY OF THE INVENTION

In the structure described in U.S. Pat. No. 8,274,587, since the PD arranged in the bulk of the semiconductor layer is isolated by the diffusion layer, dark current is reduced. On the other hand, when considering the potential distribution, the central portion of the PD has a deep potential with respect to signal charges, and the end portion of the PD has high potential. In the structure described in U.S. Pat. No. 8,274,587, a transfer gate for transferring signal charges in the PD in the bulk is arranged on the main surface of the semiconductor layer so as to correspond to the end portion of the PD in the bulk. Since the PD in the bulk is arranged away from the main surface, it is difficult for the transfer gate arranged on the main surface of the semiconductor layer to generate enough electric field that decreases the potential at the end portion of the PD in the bulk to the degree of the potential at the center of the PD. Therefore, it is necessary to design the height of the potential in the end portion of the PD in the bulk to be low so that signal charges can be transferred by the electric field generated by the transfer gate. As a result, the saturation signal amount of the PD in the bulk decreases, because the potential dip between the end portion and center portion of the PD is small.

Some embodiments of the present invention provide a technique advantageous in increasing a saturation signal amount and suppressing noise.

According to some embodiments, a photoelectric conversion device including a plurality of pixels arranged in a semiconductor layer comprising a first main surface and a second main surface on an opposite side of the first main surface, wherein each of the plurality of pixels comprises: a first photodiode including a first region of a first conductivity type where signal charges are accumulated; a second photodiode arranged between the first region and the second main surface so as to at least partially overlap the first region in an orthogonal projection with respect to the first main surface, and including a second region of the first conductivity type where signal charges are accumulated; a third region of a second conductivity type opposite to the first conductivity type arranged between the first region and the second region; and a first electrode arranged on the first main surface so as to cover the first region, and signal charges accumulated in the second region are transferred to the first region via a transfer portion formed in the third region by controlling a potential of the first electrode, is provided.

Further features of the present invention will become apparent from the following description of exemplary embodiments (with reference to the attached drawings).

BRIEF DESCRIPTION OF THE DRAWINGS

FIG. 3 is a potential diagram of the pixel shown in FIG. 1;

FIG. 4 is a timing chart upon operating the pixel shown in FIG. 1;

FIG. 5 is a graph showing the photoelectric conversion characteristics of the pixel shown in FIG. 1;

FIG. 7 is a potential diagram of the pixel shown in FIG. 6;

FIG. 10 is a plan view showing another modification of the pixel shown in FIG. 1;

FIG. 11 is a sectional view showing an arrangement example of the pixel shown in FIG. 10; and FIG. 12 is a circuit diagram for explaining a method of reading out a signal from the pixel shown in FIG. 10.

DESCRIPTION OF THE EMBODIMENTS

Figure 1:
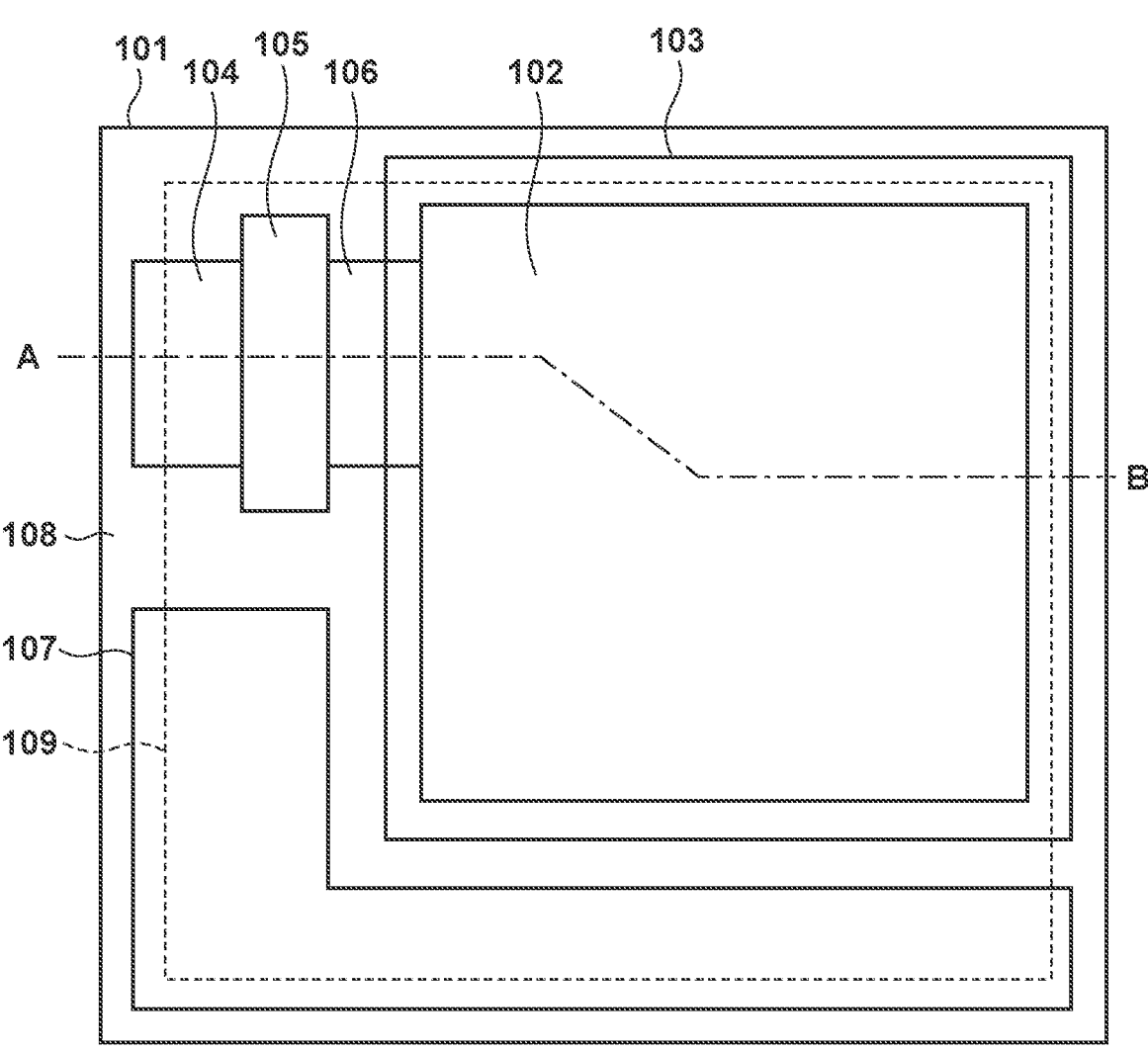
FIG. 1 is a plan view showing an arrangement example of a pixel arranged in a photoelectric conversion device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
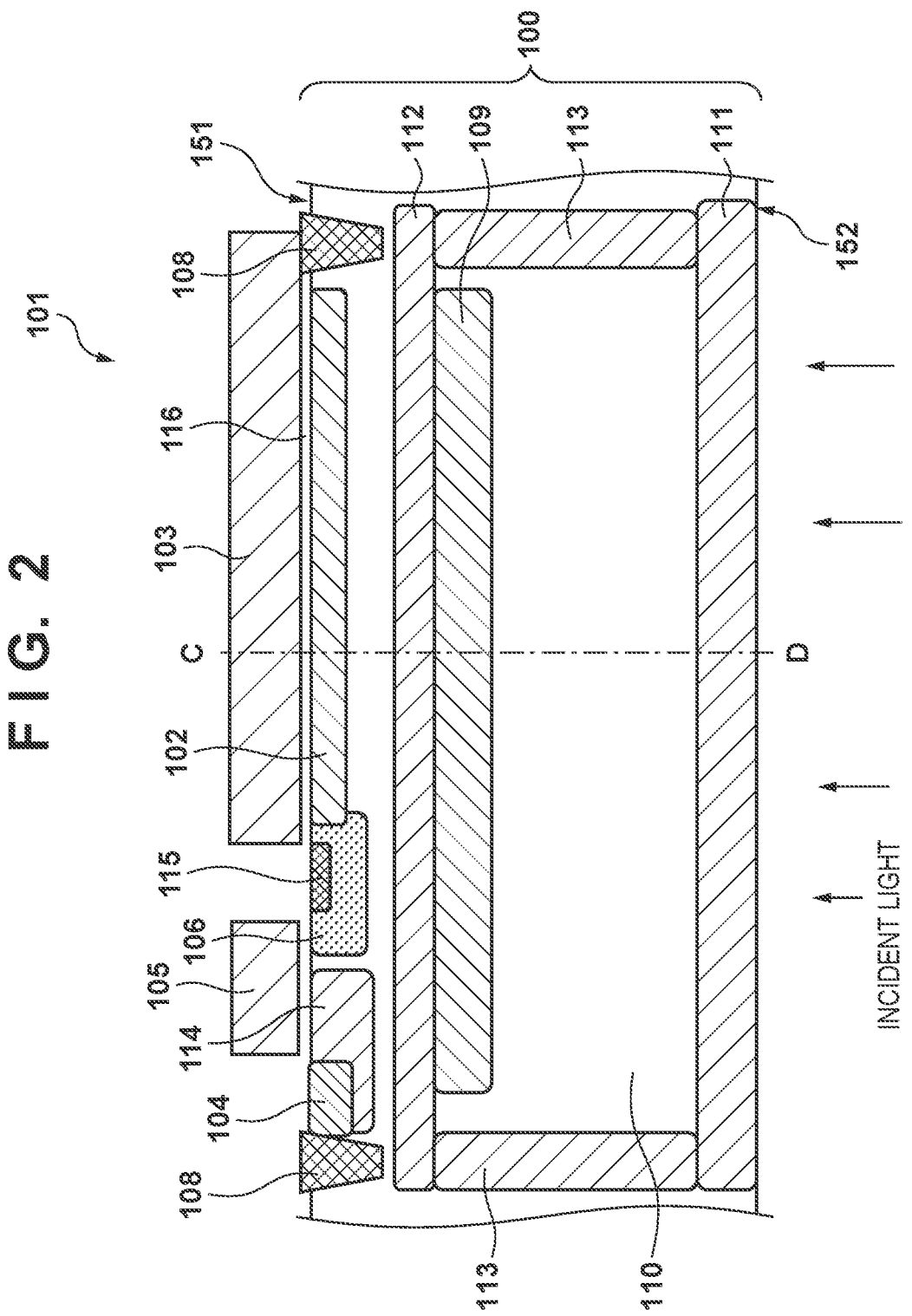
FIG. 2 is a sectional view showing the arrangement example of the pixel shown in FIG. 1.

With reference to FIGS. 1 to 12, a photoelectric conversion device according to an embodiment of the present disclosure will be described. FIG. 1 is a plan view showing an arrangement example of a pixel 101 arranged in the photoelectric conversion device according to this embodiment. FIG. 2 is the sectional view showing the arrangement example taken along the line A-B shown in FIG. 1. The photoelectric conversion device includes a plurality of the pixels 101 arranged in a semiconductor layer 100 including a main surface 151 and a main surface 152 on the opposite side of the main surface 151. A semiconductor such as silicon is used for the semiconductor layer 100. FIGS. 1 and 2 show one pixel 101. Image data can be generated using signals obtained by the plurality of the pixels 101. The image data can be transmitted to a display device or the like, and displayed as an image. The display device may be included in the photoelectric conversion device, or may be arranged outside the photoelectric conversion device.

The pixel 101 includes a photodiode (to be sometimes referred to as a PD hereinafter) including a region 102 of an n-type conductivity where signal charges are accumulated, a PD arranged between the region 102 and the main surface 152 so as to at least partially overlap the region 102 in an orthogonal projection with respect to the main surface 151, and including an n-type region 109 where signal charges are accumulated, a region 112 of a p-type conductivity opposite to the n-type conductivity arranged between the region 102 and the region 109, and an electrode 103 arranged on the main surface 151 so as to cover the region 102. The electrode 103 may cover the entire region 102 as shown in FIG. 1. In this embodiment, it will be described that electrons are accumulated as signal charges in the PD, but the present invention is not limited to this. It may be configured to accumulate holes as signal charges, and the n-type and the p-type may be reversed.

The PD including the region 102 is arranged so as to contact the main surface 151 of the semiconductor layer 100. The region 102 may form a part of the main surface 151 of the semiconductor layer 100. On the other hand, the PD including the region 109 is arranged in the bulk of the semiconductor layer 100 away from the main surface 151 of the semiconductor layer 100. The region 112 is arranged to separate the PD including the region 102 from the PD including the region 109.

The pixel 101 further includes an n-type region 104 to which signal charges are transferred from the region 102, a p-type region 114 arranged between the region 102 and the region 104, and an electrode 105 arranged on the main surface 151 so as to cover the region 114 to transfer signal charges from the region 102 to the region 104. The region 104 functions as a floating diffusion (to be sometimes referred to as an FD hereinafter) to which signal charges are transferred from the two PDs arranged in the pixel 101. As shown in FIG. 2, the p-type region 114 may cover the bottom portion (the side of the main surface 152 of the semiconductor layer 100) of the region 104. Further, an n-type region 106 serving as a transfer path to transfer signal charges below the electrode 105 is arranged between the region 102 and the region 114.

The pixel 101 also includes a p-type region 111 arranged between the main surface 152 and the region 109, an n-type region 110 arranged between the region 111 and the region 109, where the impurity concentration is lower than in the region 109, and a p-type region 113 arranged between the region 112 and the region 111 so as to surround the region 109 and the region 110. The region 111 may be arranged so as to contact the main surface 152 of the semiconductor layer 100. In other words, the region 111 may form a part of the main surface 152 of the semiconductor layer 100. The region 113 is arranged to separate the pixels 101 from each other, particularly, the PDs each including the region 109 from each other. As shown in FIG. 2, the pixel 101 of the photoelectric conversion device is configured such that light enters from the main surface 152 of the semiconductor layer 100.

Further, in the pixel 101, an output circuit 107 including a transistor, which amplifies and outputs signal charges transferred to the region 104 functioning as the FD, and the like, and a dielectric isolation portion 108 configured to separate the PD and the like from the transistor and the like arranged in the output circuit 107 are arranged. Silicon oxide or the like is used for the dielectric isolation portion 108. In addition, a gate insulating film 116 is arranged between the main surface 151 of the semiconductor layer 100 and the electrode 103 and between the main surface 151 of the semiconductor layer 100 and the electrode 105. Silicon oxide or the like is used for the gate insulating film 116. Further, as shown in FIG. 2, a p-type region 115 may be arranged between the electrode 103 and the electrode 105 so as to contact the main surface 151 of the semiconductor layer 100. The region 115 is arranged such that its bottom portion and side portion are surrounded by the region 106.

The electrode 103 is a transfer electrode for transferring signal chargers (electrons) accumulated in the n-type region 109 to the n-type region 102. The p-type region 113 is set to have a higher potential barrier to electrons than the p-type region 112. More specifically, the impurity concentration in the region 113 may be higher than the impurity concentration in the region 112. Accordingly, electrons generated by incident light are accumulated mainly in the n-type region 109, but if the region 109 is saturated, the electrons overflow mainly to the n-type region 102.

FIG. 3 is a potential diagram along a line C-D shown in FIG. 2. FIG. 3 shows the potentials in a case in which the potential of the electrode 103 changes between a low potential VL and a high potential VH. In FIG. 3, the ordinate represents the potential energy for electrons. The higher potential as the voltage scale, the lower the potential energy for electrons having negative charge. The positions along the line C-D are close to the central portion of each of the region 102 and the region 109. Therefore, the line C-D passes the vicinity of the bottom of potential which appears when the two n-type regions 102 and 109 serving as the signal charge (electron) accumulating layers are depleted.

In FIG. 3, a solid line indicates the potential in a case in which the electrode 103 is at the potential VL, and shows a state during an operation of accumulating signal charges. The electrode 103 may be made of, for example, a semiconductor such as n-type polysilicon. Hence, the work function of the region 102 is substantially equal to the work function of the electrode 103. Therefore, as in the channel portion of a general CCD, when the region 102 is depleted, a buried potential structure is generated in which the bottom of potential is slightly closer to the bulk side than the main surface 151 of the semiconductor layer 100 as shown in FIG. 3. In this state, the p-type region 112 is not depleted, and the n-type region 102 and the n-type region 109 are separated from each other. The potential VL may be set to be sufficiently low to set the main surface 151 of the semiconductor layer 100 in a pinning state, that is, a state in which holes exist in the vicinity of the main surface 151 of the semiconductor layer 100. By setting this state, even with the structure in which the region 102 contacts the main surface 151 of the semiconductor layer 100, the influence of a dark current generating at the interface between the main surface 151 of the semiconductor layer 100 and the gate insulating film 116 can be suppressed.

In FIG. 3, a dotted line indicates the potential in a case in which the electrode 103 has changed from the potential VL to the potential VH, and shows a state during an operation of transferring signal charges (electrons) from the region 109 to the region 102 in the vertical direction in FIG. 2. In order to explain this potential change, let C1 be the capacitance between the electrode 103 and the region 102, and C2 be the capacitance between the n-type region 102 and the p-type region 112. The capacitance C1 is substantially the capacitance of the gate insulating film 116. The capacitance C2 is the p-n junction capacitance between the region 102 and the region 112. The relationship between C1 and C2 is designed to be expressed as C1>C2. The potential change amount $\Delta V$ in the region 102 is expressed as $\Delta V=(VH-VL) \times C1/(C1+C2)$. In addition, the region 112 is set so as to be depleted when the potential of the region 102 rises at the time of transferring signal charges. Accordingly, C2 becomes even smaller when transferring signal charges than when accumulating signal charges. Thus, C1>>C2, and $\Delta V \approx (VH-VL)$.

Hence, the relative potential relationship between the electrode 103 and the region 102 does not largely change during transfer of signal charges from that during accumulation of signal charges, and the buried potential structure of the region 102 is maintained as shown in FIG. 3. Further, as shown by the potential indicated by the dotted line, when transferring signal charges, the potential barrier generated by the p-type region 112 disappears, and electrons accumulated in the n-type region 109 are transferred to the n-type region 102. That is, signal charges (electrons) accumulated in the region 109 are transferred to the region 102 via a transfer portion 301 formed in the region 112 by controlling the potential (potential VL→potential VH) of the electrode 103.

During this transfer of signal charges, if the potential of the region 102 is not of the buried structure and the main surface 151 of the semiconductor layer 100 is the bottom of potential, electrons gather in the vicinity of the main surface 151 of the semiconductor layer 100. In general, many electron trapping levels exist at the interface between the main surface 151 of the semiconductor layer 100 and the gate insulating film 116, so that electrons may be captured and recombined with holes, thereby being annihilated. However, as has been described above, since the relationship of C1>>C2 holds during transfer of signal charges, the buried potential structure of the region 102 is maintained, and the problem such annihilation of signal electrons is unlikely to occur.

Next, transfer of signal charges from the region 102 to the region 104 serving as the FD will be described. During this transfer of signal charges, the electrode 103 is set at the potential VL, and the potential of the region 104 is set in a floating state with a high potential. With this setting, the potential of the electrode 105 is changed from the low potential to the high potential, thereby transferring signal charges. The electrons serving as signal charges are transferred from the region 102 to the region 104 via the region 106 and a channel region formed in the semiconductor layer 100 immediately below the electrode 105. The transferred signal charges causes, for example, the voltage change of the region 104, which is output to a signal output line via an amplification transistor. In this case, noise removal or the like may be performed in a readout circuit connected to the signal output line. The signal readout operation can be similar to that in a general CMOS sensor or the like, and a detailed description will be omitted.

As can be seen from the potential during signal accumulation (potential VL) indicated by the solid line in FIG. 3, the potential barrier formed by the p-region 112 with respect to the n-type region 109 is lower than the potential barrier formed by the p-region 112 with respect to the n-type region 102. Further, in general, the capacitance of the gate insulating film per unit area is significantly larger than the p-n junction capacitance of the PD. Accordingly, the capacitance (C1+C2) of the region 102 is considerably larger than the capacitance of the region 109. Therefore, even if the area of the region 102 is somewhat smaller than the area of the region 109, the number of saturation electrons of the region 102 is larger than the number of saturation electrons of the region 109. For example, the number of saturation electrons of the region 102 can be several times or larger than the number of saturation electrons of the region 109.

FIG. 4 is a graph showing an example of timings of the transfer pulses upon transferring signal charges from the region 109 to the region 102. When the operation of accumulating signal charges ends, electrons have been accumulated as signal charges in each of the region 102 and the region 109. Let a signal S2 be a signal generated by signal charges accumulated in the region 102, and a signal S9 be a signal generated by signal charges accumulated in the region 109. The first pulse input to the electrode 105 shown in FIG. 4 is a pulse for transferring the signal S2 accumulated in the region 102 to the region 104. At this time, the region 102 is depleted. Then, the pulse input to the electrode 103 causes the signal S9 accumulated in the region 109 to be transferred to the region 102. Thereafter, the second pulse input to the electrode 105 causes the signal S9 to be transferred to the region 104. Before the signal S9 is transferred to the region 104, the signal S2 transferred to the region 104 is transferred to the output circuit 107 or the like. With the operation described above, the signal S2 and the signal S9 are independently transferred to the region 104, and the signal S2 and the signal S9 are independently read out.

Figure 5:
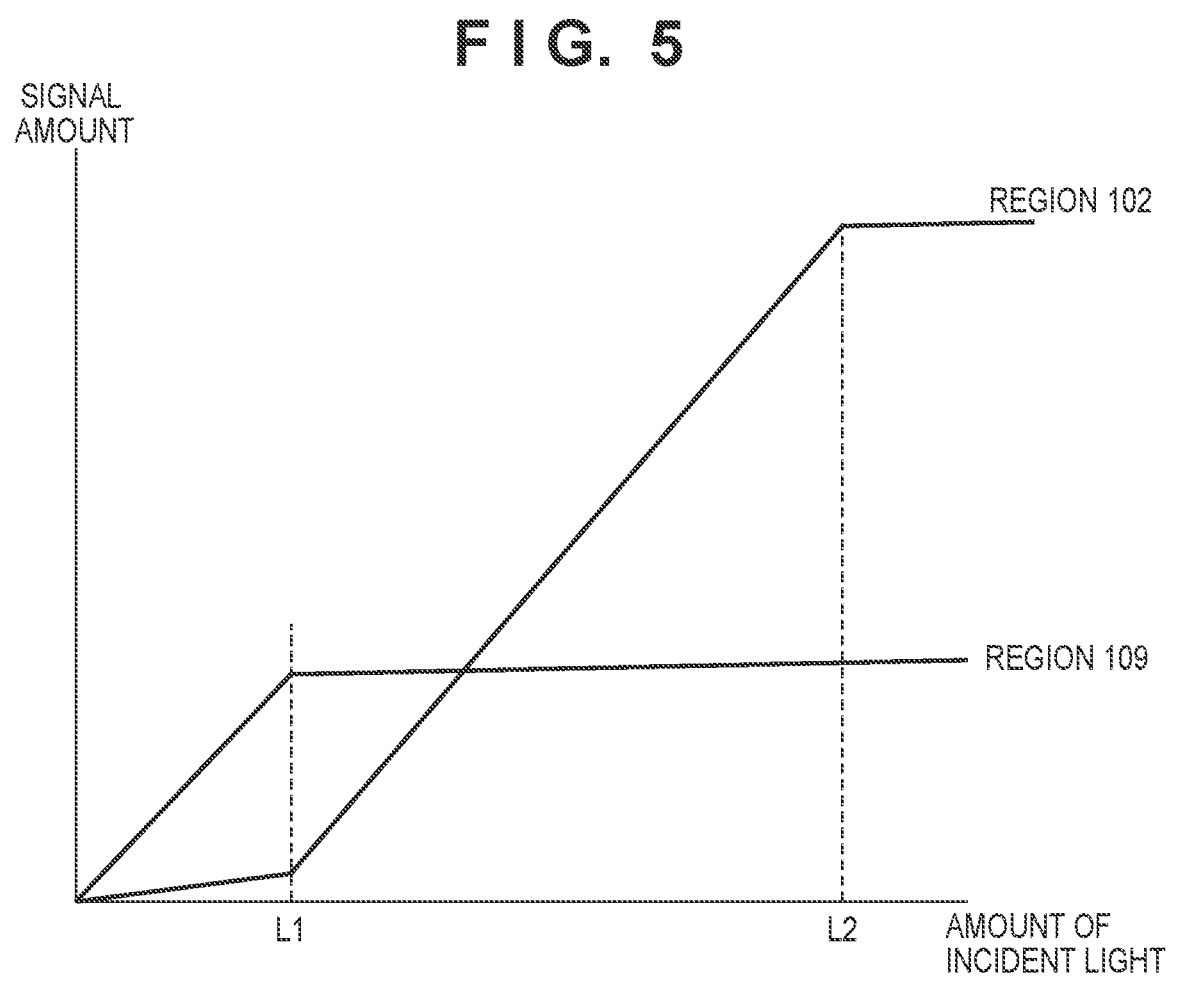

FIG. 5 is a graph showing the photoelectric conversion characteristics of the pixel 101. FIG. 5 shows the amount of electrons accumulated in each of the region 102 and the region 109 and the signal amount to be output therefrom with respect to the amount of incident light to the pixel 101. For an incident light amount L1 or less, the signal amount of the region 109 is proportional to the incident light amount. At this time, since a small amount of light also reaches the region 102, a signal corresponding to the light amount reaching the region 102 is generated in the region 102. The region 109 is saturated at the incident light amount L1. For incident light of the incident light amount L1 or more, overflow electrons flow to the region 102. The region 102 is saturated at an incident light amount L2, and electrons generated at the incident light larger than the incident light amount L2 flow to the region 104 which is set at a desired potential during the operation of accumulating signal charges.

Next, it will be explained that a low-noise high-saturation pixel signal can be obtained according to this embodiment. As has been described above, the saturation level of the region 102 is higher than that of the region 109. Further, the saturation level of the region 102 can be higher than a general buried PD of the same pixel size. It has been described above that, by setting of the potential VL, the interface of the region 102 can be set in the pinning state and a dark current can be suppressed. The thickness of a hole layer generated in the pinning state can be made smaller than the thickness of the p-type region on the surface of the semiconductor layer formed in the buried PD. Accordingly, the thickness of the region 102 serving as a signal accumulation region can be made significantly smaller than the thickness of the n-type signal accumulation region of the CMOS sensor. If the impurity concentration (here, donor concentration) is the same, the voltage required to deplete a semiconductor region is proportional to the thickness of the semiconductor region. The saturation level is proportional to the amount of donors, and transfer to the FD is easier as the depletion voltage is lower. Therefore, if the saturation amount of the region 102 is equal to that of the n-type region for signal accumulation of the buried PD of a general CMOS sensor, it is easier to transfer electrons serving as signal charges from the region 102 to the FD (region 104). In other words, the maximum saturation amount of electrons which can be transferred to the FD could be larger in the region 102 than in the buried PD.

In addition to the thickness of the n-type region for accumulating signal charges, since the region 102 is formed in the vicinity of the main surface 151 of the semiconductor layer 100, the region 102 is readily influenced by the potential of the electrode 105. In this point as well, the arrangement of the region 102 is more advantageous than the general buried PD in terms of signal transfer to the FD. However, since the thickness of the hole layer generated in the pinning state of the region 102 is small, a dark current can be larger than in the buried PD.

Since the region 109 is formed in a deeper region away from the main surface 151 of the semiconductor layer 100 than the signal accumulation region of the general CMOS sensor, the thickness of the region 109 tends to be large. Accordingly, if the voltage required for depletion is the same, the saturation signal amount of the region 109 is smaller than that of the general buried PD. However, as shown in FIG. 1, the region 109 can be formed over substantially the entire region of the pixel 101. On the other hand, the area of the signal accumulation region of the general buried PD is small since it shares the area with the output circuit 107 including the signal amplification transistor and the like. Accordingly, the saturation amount of the region 109 can be improved by increasing the area. More specifically, when comparing pixels of 3 μm×3 μm, the saturation amounts are as follows.

A general buried PD: the number of saturation electrons is about electrons.

The region 102: the number of saturation electrons is about 80,000 electrons, and the dark current is slightly large.

The region 109: the number of saturation electrons is about 10,000 electrons, and the dark current is small.

Next, the use of the signals S2 and S9 described above, which are obtained independently, will be described. Here, let SAT2 be the number of saturation electrons of the region 102, and SAT9 be the number of saturation electrons of the region 109. In FIG. 5, the region 109 is saturated at the incident light amount L1, and the region 102 is saturated at the incident light amount L2. Let a signal ΔS2 be a signal generated by electrons accumulated in the region 102 at the incident light amount L1.

If S2≤ΔS2, that is, if the incident light amount≤L1, the signal S9 alone is used as the pixel signal and the signal S2 may not be used. Since the region 109 is isolated by a diffusion layer such as the region 113, the dark current is small. Therefore, the signal S9 with small noise is used as the pixel signal. With this, the SN ratio can be increased.

If S2>ΔS2, that is, if the incident light amount>L1, a signal (S9+S2−ΔS2) is used as the pixel signal. Since the signal S2 is used, the saturation amount can be increased. A dark current of the region 102 which is slightly large as compared to the buried PD is superimposed, but since the number of signal electrons itself is large, optical shot noise becomes the dominant factor of noise, and the dark current noise contributes little to an increase of noise. The signal ΔS2 is subtracted from (S9+S2) to maintain the continuity from the signal amount in the case of the incident light amount≤L1 in the relationship between the incident light amount and the signal amount. In other words, this is to avoid the discontinuity of the photoelectric conversion characteristic at the incident light amount L1, thereby maintaining the linearity of the conversion. Since the signal ΔS2 is the amount decided in accordance with the arrangement of the pixel 101, the signal ΔS2 can be subtracted from (S9+S2).

In practice, the sum of dark current noise, readout circuit noise, and the like is usually about three to five electrons. Therefore, only in the range where the optical shot noise is 10 electrons or less, that is, the number of signal electrons is about 100 electrons or less, the dark current noise, the readout circuit noise, and the like influence the SN ratio. For example, as has been described above, in the pixel 101 of 3 μm×3 μm, if the incident light amount>L1, the number of signal electrons >10,000 electrons. Hence, the optical shot noise >100 electrons. Even if the dark current noise in the region 102 is eight electrons, which is slightly larger than that of the general buried PD, since the sum of noise components is obtained by the square root of the square sum, the sum of the 100 electrons of the optical shot noise and the eight electrons of the dark current noise is 100.32 electrons. This causes no problem with respect to the number of signal electrons.

As the basic performance of the pixel 101 of the photoelectric conversion device, the sensitivity, the saturation amount, and the dark noise are regarded to be important. The dark noise decides the SN ratio at a low signal amount. The pixel 101 in this embodiment has a so-called back-surface light incident structure, so that the incident light loss is small, and the sensitivity is comparable to that of the general buried PD having the back-surface light incident structure. Further, as has been described above, the saturation amount and the dark noise are significantly improved as compared to the general buried PD.

Examples under a condition of the pixel of 3 μm×3 μm and the use temperature of 60° C., in which dark current is likely to occur, are as follows.

A general buried PD: the saturation amount is 30,000 electrons, the dark noise is 4 electrons, and the dynamic range is 77.5 dB.

This embodiment: the saturation amount is 90,000 electrons, the dark noise is 2 electrons, and the dynamic range is 93.1 dB. To achieve the saturation amount of 90,000, the general buried PD requires a pixel size of about 6 μm×6 μm.

The use method of the signals S2 and S9 is not limited to the above-described method. When performing image capturing in a dark condition where the signal amount is small, the signal S9 alone may be used. This is a case in which the large dynamic range is not required and the SN ratio at a low signal amount is important. In this case, the signal S2 may be discarded without being read out. Accordingly, the signal readout operation may be performed only once to read out the signal S9, so that the signal readout time is shortened.

When performing image capturing in a bright condition where the signal amount is large, the signal (S2+S9) may be always used. For example, this is a case in which a high dynamic range (high saturation) is importance but the SN ratio at a low signal amount is not particularly necessary. In this case, signal charges in the region 109 may be transferred to the region 102 while signal charges are accumulated in the region 102, and then the signal charges collected in the region 102 may be transferred to the region 104 as the signal (S2+S9). Also in this case, the signal readout operation is performed once, so that the signal readout time is shortened.

As has been described above, in the pixel 101 arranged in the photoelectric conversion device according to this embodiment, the saturation signal amount is large and noise is suppressed. That is, the pixel 101 having a high dynamic range and a high SN ratio can be implemented. Further, as has been described above, it is possible to freely select the operation for obtaining a signal having a high SN ratio, the operation for obtaining a signal having a high dynamic range, or the operation for obtaining a signal having a high dynamic range due to a high SN ratio and high saturation level.

Figure 6:
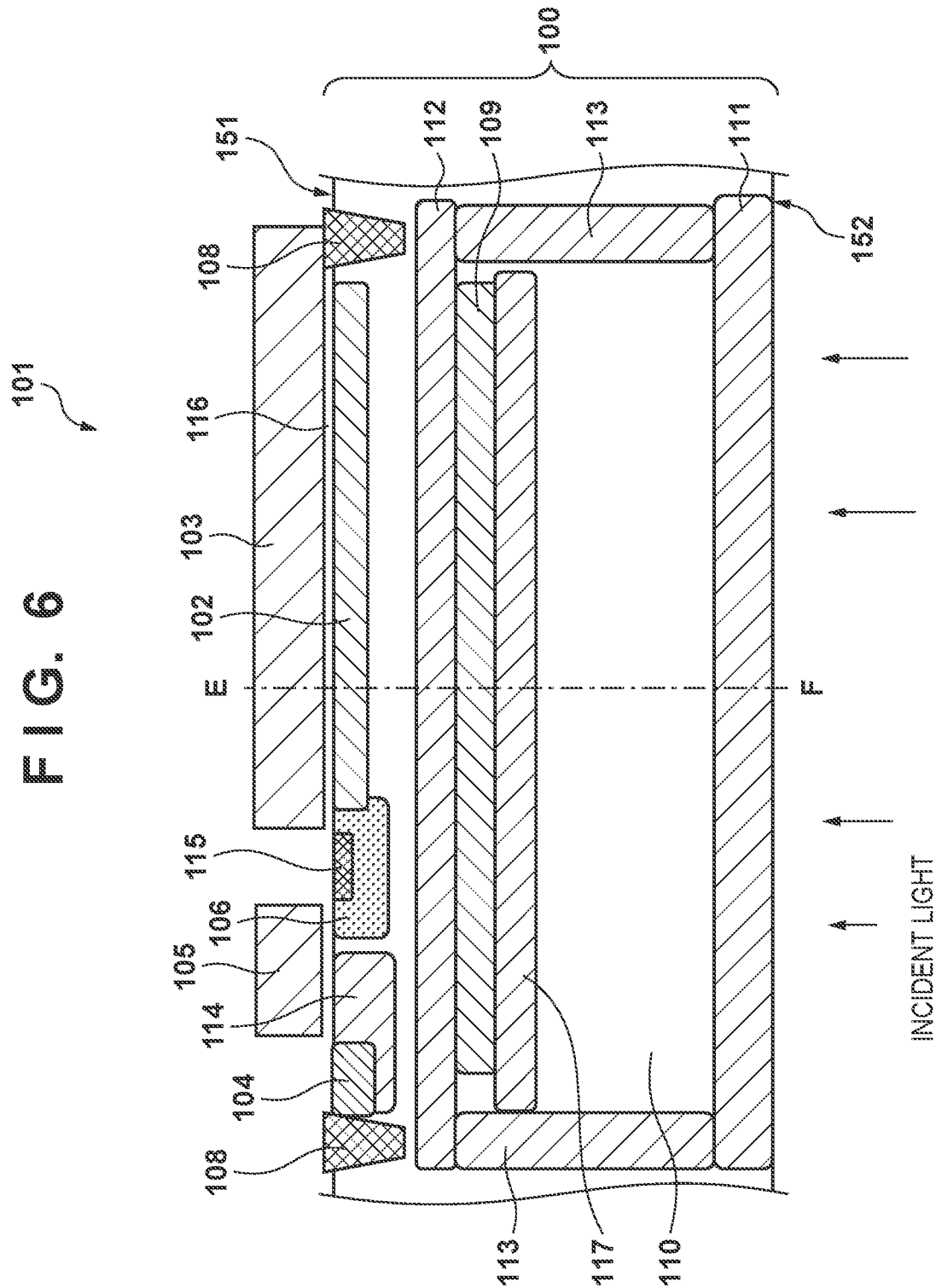
FIG. 6 is a sectional view showing another arrangement example of the pixel shown in FIG. 1.

FIG. 6 is a view showing a modification of the sectional view of the pixel 101 shown in FIG. 2. As shown in FIG. 6, the pixel 101 further includes a p-type region 117 arranged between the region 109 and the region 110. By arranging the p-type region 117, the depth-direction distribution of the impurity concentration forming the n-type region 109 partially overlaps the depth-direction distribution of the impurity concentration forming the region 117. With this, the depth-direction width of the region 109 decreases as compared to the case shown in FIG. 2 in which the region 117 is not arranged. Accordingly, if the depletion voltage of the region 109 is the same as in the arrangement shown in FIG. 2, the effective amount of impurities (donors) in the region 109 increases. Here, the "effective amount" of impurities means the difference amount between acceptors and donors when acceptors and donors exist together. With this, the saturation signal amount of the region 109 can be increased as compared to the arrangement shown in FIG. 2.

On the other hand, the region 109 has to play a role of accumulating signal charges generated in the region 110. Therefore, when performing an accumulation operation of accumulating signal charges in the region 109, at least a part of the region 117 should have been depleted. In practice, when performing the operation of accumulating signal charges, the location corresponding to the central portion of the region 117 has been depleted. Further, with respect to the potentials along a line E-F in the central portions of the regions 109 and 113 shown in FIG. 6, it is necessary to decide the impurity concentration in the p-type region 117 such that no potential barrier or an at least sufficiently low potential barrier is formed between the n-type region 109 and the region 110 as shown in FIG. 7. For example, the impurity concentrations of the regions 109 and 110 can be designed such that the impurity concentration in the region 117 does not form a potential barrier between the region 109 and the region 110.

In this manner, as compared to the arrangement shown in FIG. 2, the arrangement shown in FIG. 6 can increase the signal charge saturation amount of the region 109. The arrangement except for the region 117 is similar to the arrangement shown in FIG. 2. Accordingly, in the arrangement shown in FIG. 6, a signal having a high SN ratio with suppressed noise can be obtained. In addition, as compared to the arrangement shown in FIG. 2, the saturation signal amount increases so that the dynamic range can be increased in the photoelectric conversion device.

Figure 8:
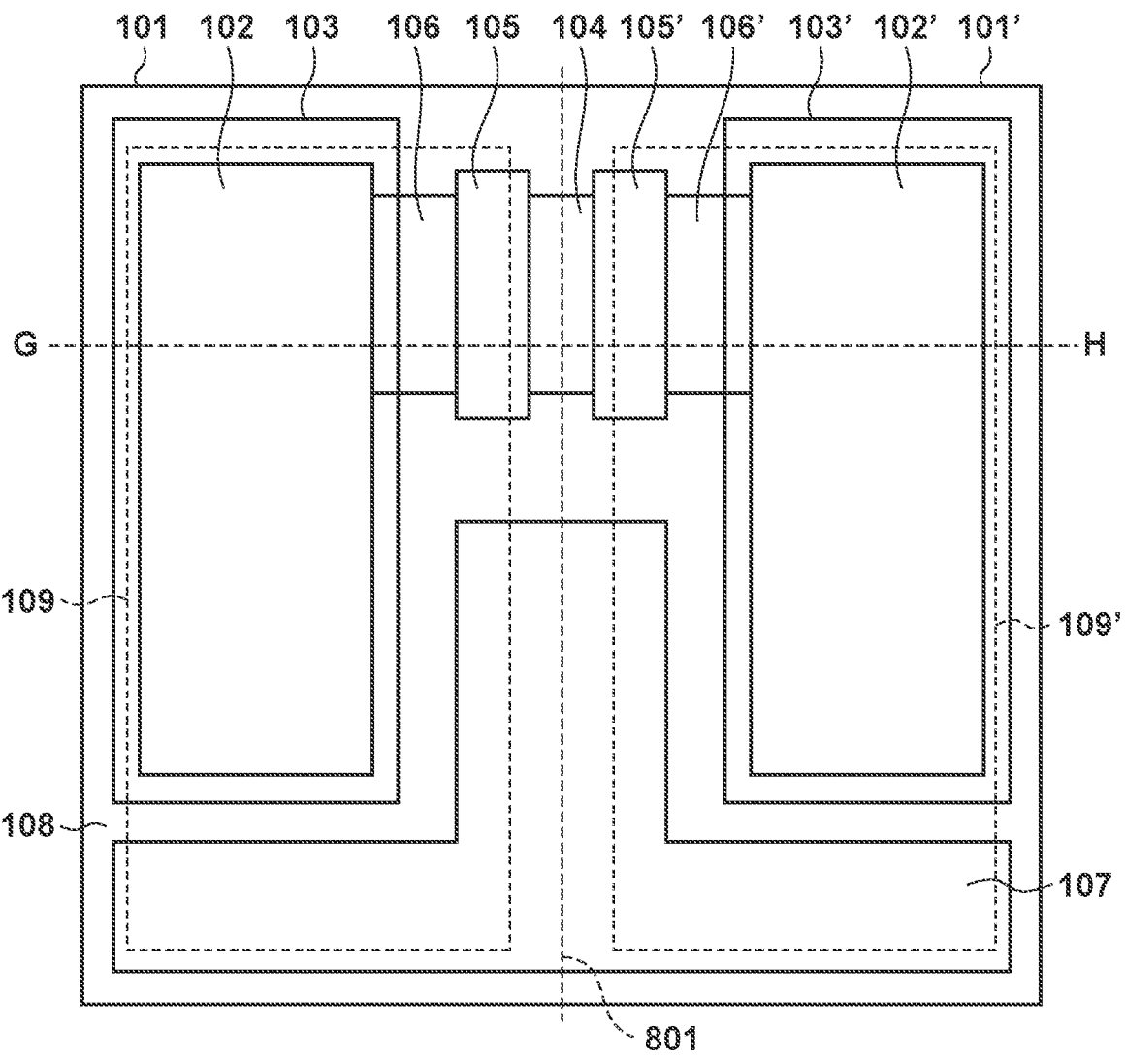
FIG. 8 is a plan view showing a modification of the pixel shown in FIG. 1.

FIG. 8 is a plan view showing a modification of the pixel 101 shown in FIG. 1. As compared to the arrangement shown in FIG. 1, two pixels 101 and 101' share the region 104 which functions as the FD. That is, it can be said that the photoelectric conversion device includes the n-type region 104 to which signal charges are transferred from the region 102 of the pixel 101 and a region 102' of the pixel 101'. For example, as shown in FIG. 8, a layout may be employed in which the pixel 101 and the pixel 101' are arranged symmetric with respect to an intermediate line 801 between the pixel 101 and the pixel 101'. Further, as shown in FIG. 8, the pixel 101 and the pixel 101' share one output circuit 107.

Figure 9:
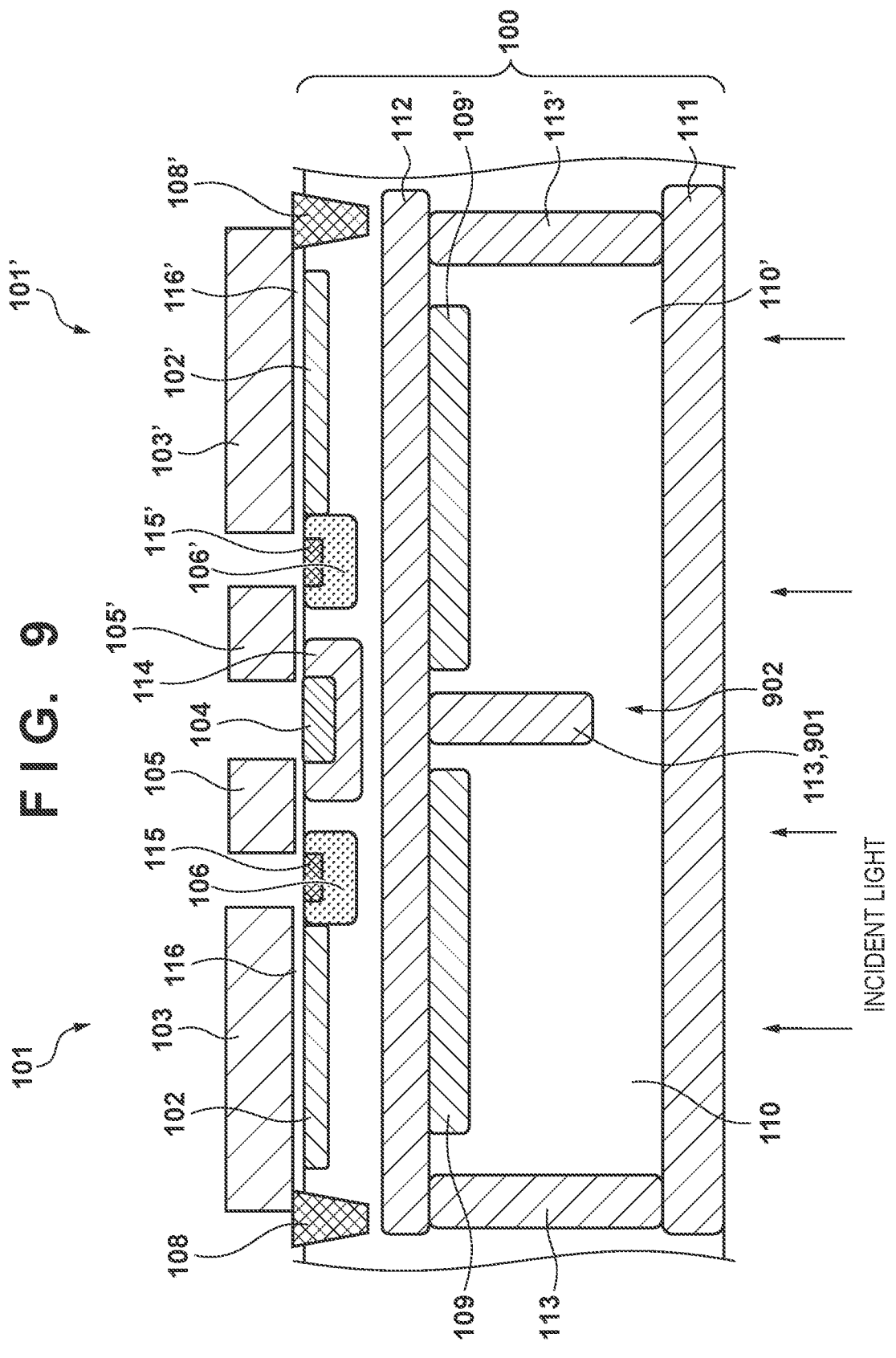
FIG. 9 is a sectional view showing an arrangement example of the pixel shown in FIG. 8.

FIG. 9 is a sectional view showing an arrangement example taken along a line G-H in FIG. 8. As shown in FIG. 9, the regions 112 of the pixels 101 and 101' sharing the region 104 may be arranged continuously. Similarly, the regions 111 of the pixels 101 and 101' may be arranged continuously. In addition, between a portion 901 of the region 113 of the pixel 101 and the pixel 101' arranged between the pixel 101 and the pixel 101' and the continuously arranged region 111, a portion 902 where the region 110 of the pixel 101 and a region 110' of the pixel 101' are continuous may be included. That is, the separating degree of the portion 901 of the p-type region 113 surrounding the n-type regions 109 and 109' and the regions 110 and 110', the portion 901 being arranged between the pixel 101 and the pixel 101', is lower than the separating degree of the remaining portion of the p-type region 113 surrounding the outer peripheries of the pixels 101 and 101' sharing the region 104. Therefore, if the region 109 and 109' of one of the pixels 101 and 101' is saturated, overflow signal charges flow to the region 109 of the other one of the pixels 101 and 101' or the regions 102 and 102' of the pixels 101 and 101'.

In the pixels 101 and 101', the electrodes 103 and 103' and the electrodes 105 and 105' are independently driven, so that it is possible to independently read out signals from four PDs arranged in the pixels 101 and 101'. Accordingly, the photoelectric conversion device including the pixels 101 and 101' shown in FIG. 9 can have an autofocus function based on the difference in signal amount between the pixel 101 and the pixel 101', if the common one optical micro-lens is formed on the two pixels.

In the arrangement shown in FIG. 9, the portion 901 of the region 113 weakly separates the region 110 from the region 110'. However, the present invention is not limited to this, and the portion 901 may separate the region 110 from the region 110' like other portions of the region 113. The two electrically independent pixels 101 and 101' may share the region 104 functioning as the FD.

For example, the pixels 101 and 101' may be square. In this case, the arrangement shown in FIG. 8 may be reduced vertically (alternatively, enlarged horizontally) to make square pixels. The direction in which the two pixels 101 and 101' sharing the region 104 are adjacent to each other may be the same as or intersect the extending direction of the signal output line. Further, FIG. 8 shows an example in which the two pixels 101 and 101' share one region 104, but in accordance with the shape of the pixel, three or more pixels may share the region 104 functioning as one FD.

It has been described above that the pixels 101 and 101' shown in FIG. 8 function as two independent pixels, but they can also be used as one pixel. In this case, a sum of a signal generated by signal charges accumulated in the region 102 and a signal generated by signal charges accumulated in the region 102', and a sum of a signal generated by signal charges accumulated in the region 109 and a signal generated by signal charges accumulated in the region 109' are used as a pixel signal. Therefore, in the operation shown in FIG. 4, in order to transfer signals to the region 104, the electrodes 103 and 103' may be simultaneously driven and the electrodes 105 and 105' may be simultaneously driven. At this time, two signal charges derived from the pixel 101 and the pixel 101' are added in the region 104. When adding an autofocus function or the like to the pixels 101 and 101', the pixel 101 and the pixel 101' can function as one pixel. For autofocus, the signal from the pixel 101 and the pixel from the pixel 101' are required. That is, the method of reading out the signals from the pixels 101 and 101' may change between a case of acquiring pixel signals and a case of acquiring signals for autofocus. The portion 902 shown in FIG. 9 has a structure suitable for acquisition of signals for autofocus. The portion 902 has no influence in acquisition of pixel signals.

In the arrangement shown in FIGS. 8 and 9, the multiple pixels 101 and 101' share the FD. Therefore, the output circuit 107 where the signal amplification transistor is arranged is also shared. As a result, it is possible to increase the area per pixel that the region 102 can occupy. That is, the signal saturation amounts in the pixels 101 and 101' can be increased.

FIG. 10 is a plan view showing another modification of the pixel 101 shown in FIG. 1. FIG. 11 is a sectional view showing an arrangement example taken along a line I-J shown in FIG. 10. As compared to the pixel 101 shown in FIGS. 1 and 2, in a pixel 101" shown in FIGS. 10 and 11, a p-type region 119 surrounded by the n-type region 102 and arranged between the main surface 151 of the semiconductor layer 100 and the region 112 while being spaced apart from the region 112 is arranged. The region 119 can be arranged so as to contact the main surface 151 of the semiconductor layer 100. Further, the region 119 is not covered with the electrode 103. Therefore, the electrode 103 has a square donut-like shape with a hollow portion corresponding to the p-type region 119.

From the above description, it can be seen that a vertical junction field effect transistor (to be sometimes referred to as a JFET hereinafter) is formed in which the region 102 functions as a control electrode and the region 112 and the region 119 function as main electrodes (in the arrangement shown in FIG. 11, the region 119 functions as a source, and the region 112 functions as a drain) when reading out signal charges in the region 102. The region 104 functions as the FD in the pixel 101 described above, but in the pixel 101" shown in FIGS. 10 and 11, a fixed potential, which is basically a power supply potential, can be supplied to the region 104. Further, although not shown in FIG. 11, a wiring pattern is formed which passes through a portion on the region 119 where the electrode 103 is not arranged, and connects to the region 119.

In a general buried PD, a fixed potential is supplied to the p-type region arranged so as to contact the main surface 151 of the semiconductor layer 100. Therefore, it is very difficult to form a p-type region which serves as a source of the JFET in the buried PD. As has been described above, since the region 102 does not have the structure of the buried PD, it is possible to form the JFET in the pixel 101".

FIG. 12 shows a circuit arrangement upon reading out a signal from the pixel 101". In FIG. 12, a JFET 121 is a JFET formed from the above-described regions 102, 112, and 119. The JFET 121 outputs a signal to a signal output line 122, which is shared by the multiple pixels 101" for each column, via a switch element 123 such as a transistor arranged in the output circuit 107. The signal output line 122 is connected to a readout circuit 124. For example, the readout circuit 124 can be arranged outside the pixel 101" as shown in FIG. 12.

Next, an operation of reading out a signal from the pixel 101" will be described. The switch element 123 of the pixel 101" from which the signal is read out is set in an ON state. At this time, among the pixels 101" connected to the same signal output line 122, the switch elements 123 of the pixels 101" other than the pixel 101" which outputs the signal are set in an OFF state. The electrode 103 of the pixel 101" from which the signal is read out is set at a potential (potential VL) equal to that for accumulating signal charges, or about a potential at which the region 102 contacts the main surface 151 of the semiconductor layer 100 but is not set in the pinning state. A predetermined current is supplied from the readout circuit 124 to the signal output line 122.

When the above-described state is set, the JFET 121 performs a source follower operation, and the potential of the region 102 of the pixel 101", in other words, the potential corresponding to the amount of signal charges accumulated in the region 102 appears on the signal output line 122 from the region 119. That is, in accordance with the amount of signal charges in the region 102, an amplification signal by the JFET 121 is output to the region 119, and read out by the readout circuit 124.

After the signal readout operation ends, the potential of the electrode 105 is set at high level, and the signal charges accumulated in the region 102 are discharged to the region 104 to which the fixed potential is supplied. Thus, the region 102 is reset. In the readout operation described above, the signal charges accumulated in the region 102 may be signal charges accumulated in the region 102 during the accumulation period (this corresponds to the signal S2 described above). Alternatively, in the readout operation, the signal charges accumulated in the region 102 may be signal charges accumulated in the region 109 and transferred to the region 102 (this corresponds to the signal S9 described above). Further, in the readout operation, the signal charges accumulated in the region 102 may be a sum of signal charges accumulated in the region 102 and signal charges accumulated in the region 109 (this corresponds to the signal (S2+S9) described above).

In the pixel 101", when accumulating signal charges, the signal output line 122 is set to the potential equal to the potentials of the regions 111, 112, and 113 of the pixel 101", and the switch element 123 is set in the ON state. With this, the source and drain of the JFET 121 are set at the same potential so no current flows. That is, the signal accumulation operation as in the pixel 101 described above is performed.

In the pixel 101", the output circuit 107 may include the switch element 123 alone, and a transistor for FD reset and a transistor for signal amplification, which are necessary in a general CMOS sensor or the like, may not be arranged. Thus, the number of components necessary for the pixel 101" can be reduced. That is, as compared to the pixel 101 described above, the area of the output circuit 107 can be decreased and the ratio (area) of the region 102 occupying in one pixel can be increased in the pixel 101". That is, the saturation signal amount can be further improved. Further, the source follower circuit using the JFET generally has lower noise than the source follower circuit using a MOS transistor, so that the SN ratio of a signal output from the pixel 101" can be increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-100419, filed Jun. 22, 2022, which is hereby incorporated by reference herein in its entirety.

What is claimed is:

1. A photoelectric conversion device including a plurality of pixels arranged in a semiconductor layer comprising a first main surface and a second main surface on an opposite side of the first main surface, wherein each of the plurality of pixels comprises:

a first photodiode including a first region of a first conductivity type where signal charges are accumulated, wherein the first region forms a part of the first main surface;

a second photodiode arranged between the first region and the second main surface so as to at least partially overlap the first region in an orthogonal projection with respect to the first main surface, and including a second region of the first conductivity type where signal charges are accumulated;

a third region of a second conductivity type opposite to the first conductivity type arranged between the first region and the second region; and a first electrode arranged on the first main surface so as to cover the first region, and signal charges accumulated in the second region are transferred to the first region via a transfer portion formed in the third region by controlling a potential of the first electrode.

2. The device according to claim 1, wherein the first electrode is a semiconductor of the first conductivity type.

3. The device according to claim 1, wherein a work function of the first region is equal to a work function of the first electrode.

4. The device according to claim 1, wherein each of the plurality of pixels further comprises a fourth region of the second conductivity type arranged between the second main surface and the second region, a fifth region of the first conductivity type arranged between the fourth region and the second region, where an impurity concentration is lower than in the second region, and a sixth region of the second conductivity type arranged between the third region and the fourth region so as to surround the second region and the fifth region.

5. The device according to claim 4, wherein an impurity concentration in the sixth region is higher than an impurity concentration in the third region.

6. The device according to claim 4, wherein each of the plurality of pixels further comprises a seventh region of the second conductivity type arranged between the second region and the fifth region.

7. The device according to claim 6, wherein when accumulating signal charges in the second region, at least a part of the seventh region has been depleted.

8. The device according to claim 6, wherein an impurity concentration in the seventh region is a concentration that does not form a potential barrier between the second region and the fifth region.

9. The device according to claim 4, wherein the plurality of pixels include a first pixel and a second pixel arranged so as to be adjacent to each other, the device further includes an eighth region of the first conductivity type to which signal charges are transferred from the first region of the first pixel and the first region of the second pixel, each of the first pixel and the second pixel further includes a ninth region of the second conductivity type arranged between the first region and the eighth region, and a second electrode arranged on the first main surface so as to cover the ninth region to transfer signal charges from the first region to the eighth region, the fourth region of the first pixel and the fourth region of the second pixel are arranged continuously, and between a portion of the sixth region of the first pixel and the second pixel arranged between the first pixel and the second pixel and the continuously arranged fourth region, a portion where the fifth region of the first pixel and the fifth region of the second pixel are continuous is included.

10. The device according to claim 1, wherein each of the plurality of pixels further comprises an eighth region of the first conductivity type to which signal charges are transferred from the first region, a ninth region of the second conductivity type arranged between the first region and the eighth region, and a second electrode arranged on the first main surface so as to cover the ninth region to transfer signal charges from the first region to the eighth region.

11. The device according to claim 1, wherein the plurality of pixels include a first pixel and a second pixel arranged so as to be adjacent to each other, the device further includes an eighth region of the first conductivity type to which signal charges are transferred from the first region of the first pixel and the first region of the second pixel, and each of the first pixel and the second pixel further includes a ninth region of the second conductivity type arranged between the first region and the eighth region, and a second electrode arranged on the first main surface so as to cover the ninth region to transfer signal charges from the first region to the eighth region.

12. The device according to claim 1, further including a tenth region of the second conductivity type surrounded by the first region and arranged between the first main surface and the third region while being spaced apart from the third region.

13. The device according to claim 12, wherein the tenth region is not covered with the first electrode.

14. The device according to claim 12, wherein a junction field effect transistor is formed in which the first region functions as a control electrode and the third region and the tenth region function as main electrodes when reading out signal charges in the first region, and in accordance with an amount of the signal charges in the first region, an amplification signal by the junction field effect transistor is output to the tenth region.

15. The device according to claim 1, wherein the device is configured such that light enters from the second main surface.

16. The device according to claim 1, wherein in a section perpendicular to the first main surface and passing through the first region, the second region, the third region, and the first electrode, the first electrode is arranged so as to entirely overlap the first region.

17. A photoelectric conversion device including a plurality of pixels arranged in a semiconductor layer comprising a first main surface and a second main surface on an opposite side of the first main surface, wherein each of the plurality of pixels comprises:

a first photodiode including a first region of a first conductivity type where signal charges are accumulated;

a second photodiode arranged between the first region and the second main surface so as to at least partially overlap the first region in an orthogonal projection with respect to the first main surface, and including a second region of the first conductivity type where signal charges are accumulated;

a third region of a second conductivity type opposite to the first conductivity type arranged between the first region and the second region;

a fourth region of the second conductivity type arranged between the second main surface and the second region;

a fifth region of the first conductivity type arranged between the fourth region and the second region, where an impurity concentration is lower than in the second region;

a sixth region of the second conductivity type arranged between the third region and the fourth region so as to surround the second region and the fifth region; and a first electrode arranged on the first main surface so as to cover the first region, and signal charges accumulated in the second region are transferred to the first region via a transfer portion formed in the third region by controlling a potential of the first electrode.

18. A photoelectric conversion device including a plurality of pixels arranged in a semiconductor layer comprising a first main surface and a second main surface on an opposite side of the first main surface, wherein each of the plurality of pixels comprises:

a first photodiode including a first region of a first conductivity type where signal charges are accumulated;

a second photodiode arranged between the first region and the second main surface so as to at least partially overlap the first region in an orthogonal projection with respect to the first main surface, and including a second region of the first conductivity type where signal charges are accumulated;

a third region of a second conductivity type opposite to the first conductivity type arranged between the first region and the second region;

a first electrode arranged on the first main surface so as to cover the first region;

an eighth region of the first conductivity type to which signal charges are transferred from the first region;

a ninth region of the second conductivity type arranged between the first region and the eighth region; and a second electrode arranged on the first main surface so as to cover the ninth region to transfer signal charges from the first region to the eighth region, and signal charges accumulated in the second region are transferred to the first region via a transfer portion formed in the third region by controlling a potential of the first electrode.

* * * * *